United States Patent

[11] 3,568,597

[72] Inventor Henry C. Staehle
Rochester, N.Y.
[21] Appl. No. 651,003
[22] Filed July 3, 1967
[45] Patented Mar. 9, 1971
[73] Assignee Eastman Kodak Company
Rochester, N.Y.

[54] LITHOGRAPHIC PRINTING PLATE AND PROCESS
13 Claims, 5 Drawing Figs.

[52] U.S. Cl. .......... 101/450, 96/33, 101/459, 101/462, 101/466
[51] Int. Cl. .......... B41m 1/00, B41n 3/00, B41m 5/00
[50] Field of Search .......... 101/457, 459, 462, 463, 466, 450; 96/33, 36.3

[56] References Cited

UNITED STATES PATENTS

| | | | |
|---|---|---|---|
| 1,961,927 | 6/1934 | Gerking .......... | 96/33 |
| 2,058,396 | 10/1936 | Baker .......... | 96/33 |
| 2,258,956 | 10/1941 | Misuraca .......... | 101/457 |
| 2,670,285 | 2/1954 | Minsk et al. .......... | 96/33X |
| 3,169,065 | 2/1965 | Sorkin et al. .......... | 101/457X |
| 3,269,836 | 8/1965 | Greubel et al. .......... | 96/33 |
| 3,388,995 | 6/1968 | Schwerin et al. .......... | 96/33X |

*Primary Examiner*—David Klein
*Attorneys*—W. H. J. Kline, B. D. Wiese and H. E. Byers

ABSTRACT: A printing plate is prepared by the imagewise application of a polymerizable monomer such as alpha-cyano acrylate to a surface such as aluminum oxide on a support such as aluminum to form an image in polymer.

HENRY C. STAEHLE
INVENTOR.

BY Henry E. Byers

ATTORNEY

LITHOGRAPHIC PRINTING PLATE AND PROCESS

This invention is concerned with the preparation of printing plates and their use. In one aspect, this invention relates to the formation of a lithographic plate using a polymerizable monomer to form an image.

It is known to employ lithographic materials using various light sensitive resins or the like to prepare an image on a hydrophilic support. Typical light sensitive materials include diazo resins, light sensitive silver halide emulsions, cinnamic acid esters, etc. However, for many purposes, lithographic plates using these light sensitive materials to print from are unsatisfactory. For example, such plates exhibit relatively short press life and require methods of preparation which are quite complex.

For lithographic plates which are intended for a relatively long press life, e.g., 50,000 impressions, it is customary to prepare a metallic plate by the deep etch process wherein a resist is prepared on a metal surface. The metal, such as aluminum, is etched through the resist deep enough to receive an image by employing a metal salt such as cupric chloride to deposit metal in the etched image areas. The resist is then removed and the plate is used on a lithographic press. Aluminum is receptive to water whereas copper is receptive to greasy printing ink. However, it is evident that preparing the deep etch plate is complicated, time consuming, relatively expensive and employs hazardous chemicals. Therefore, it has been desirable to have a method of making a relatively long press life lithographic plate which would obviate the problems involved in making a deep etch plate.

I have now found that a relatively long press life plate can be prepared by employing a specific combination of processing steps and materials, as described hereinafter.

Accordingly, one object of this invention is to provide a lithographic plate having high quality and long press life. Another object is to prepare such a plate by a method which is less expensive, less hazardous, less complicated and less time consuming than previously known methods. A further object is to provide a method of making a lithographic plate by employing a wide variety of resist materials through which is coated a polymerizable monomeric material to form a polymeric image area. A still further object is to provide a lithographic plate having relatively wide lithographic latitude. A further object is to provide a method of coating a resist on a hydrophilic surface with an alpha-cyano acrylate material which forms a hydrophobic image area. Still other objects will be apparent from the following disclosure.

In accordance with this invention, it has been found that a novel printing plate can be prepared by a method which comprises imagewise application of a polymerizable monomer to a surface on a support upon which said monomer polymerizes to form an image in polymer.

In carrying out my invention, an element comprising a surface on a support coated with a light sensitive material is exposed to a light image. The element is then processed to provide a resist on the surface with open areas in the resist delineating an image area of the surface. The surface is then coated through the resist with a polymerizable monomer to form an image on the surface. After this imagewise application of monomer to the surface, the resist is removed leaving the image in polymer on the surface of the support. When the polymer image is hydrophobic and has an affinity for greasy printing ink with respect to a hydrophilic surface area which has affinity for water, the resulting plate is particularly useful on a lithographic printing press.

In one embodiment of my invention, I employ an anodized aluminum support, i.e., aluminum having thereon an aluminum oxide layer, over which is coated a silver halide emulsion. After exposure and development, the emulsion is etch bleached to provide a gelatin resist image. An alpha-cyano acrylate monomer is applied to the resist and the aluminum oxide surface areas exposed by the etch bleaching of the resist. The monomer polymerizes upon the surface of the aluminum support to form as image in polymer. The adhesive adheres to both the resist and the aluminum oxide surface, but the resist is removed using a hypochlorite solution which softens the gelatin and enables it to be removed from the aluminum surface. This provides a lithographic printing plate having the image areas coated with alpha-cyano acrylate polymer, adhering firmly to the aluminum oxide layer on the aluminum support. The lithographic plate is used for printing on a lithographic press.

In other embodiments of the invention, other supports are used as well as other light sensitive resist forming materials. An alpha-cyano acrylate monomer, upon being coated on the support, polymerizes to form a polymer which adheres firmly and provides a plate having relatively long press life.

The drawing shows one embodiment of my invention:

FIG. 1 shows a support 10 having thereon a silver halide emulsion 12 with a latent image 14.

Figure 1:
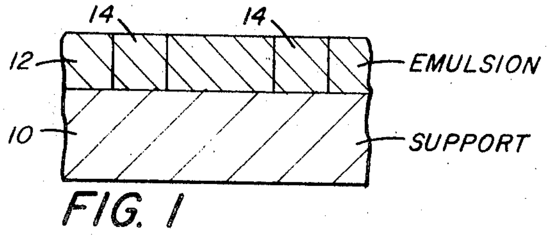
Figure 2:
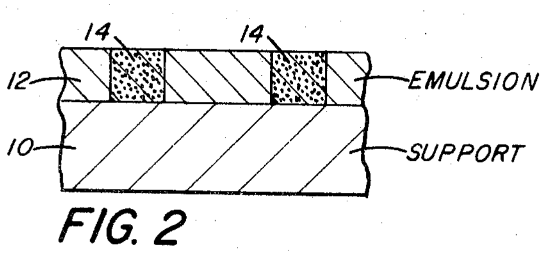
FIG. 2 shows the same photographic element of FIG. 1 after development with a silver halide developer.
Figure 3:
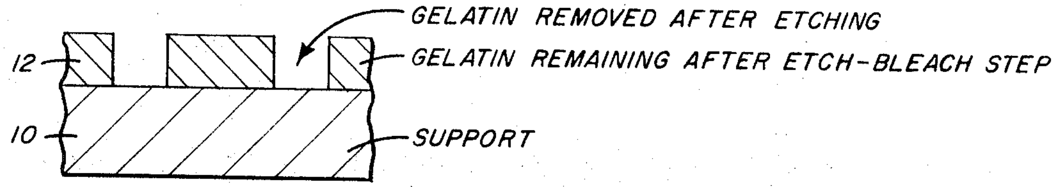
FIG. 3 shows the same photographic element of FIG. 2 in which the image areas 14 have been removed by the etch bleach step with the unaffected gelatin 12 remaining.
Figure 4:
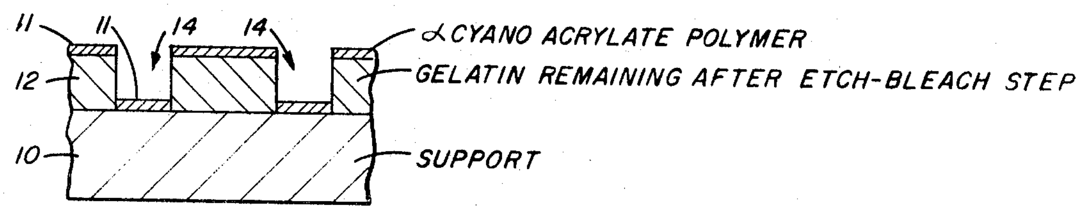

FIG. 4 shows the element after it has been treated with an alpha-cyano acrylate monomer to form a polymer 11 on the gelatin areas 12 remaining and on the support 10 in areas 14 where gelatin has been removed.

Figure 5:
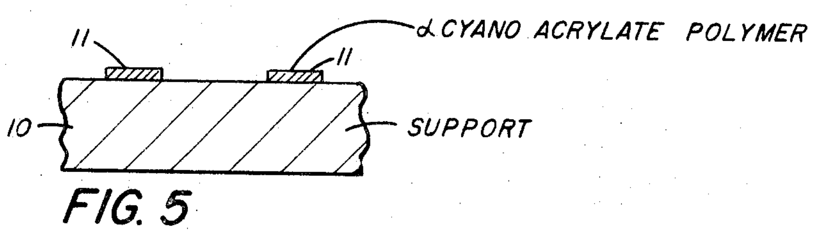

FIG. 5 shows the element with support 10 having the remaining gelatin 12 removed leaving the alpha-cyano acrylate polymer 11 image areas remaining.

In practicing this invention, a photographic element, as described herein, is placed in a bath which removes exposed and developed light-sensitive material imagewise. This results in a support having thereon a resist or stencil with areas of the surface having been removed imagewise. The imagewise open areas of the stencil or resist expose an image area of the surface under the resist or stencil. A polymerizable adhesive, preferably a polymerizable ethylenically unsaturated monomer, is applied over the resist, adhering to the resist and also to the surface of the support in the open image areas in the resist. The resist is then removed by treating with a solvent which removes the resist but which does not have any appreciable solvent effect on the adhesive which has formed an image in polymer. The lithographic plate can now be placed on a lithographic press and used for printing.

It will be appreciated that the resist forming materials which may be used to carry out the invention vary widely and include diazo resins, light sensitive cinnamic acid esters, sensitized rubber materials, both natural and synthetic, silver halide emulsions, etc. A particularly useful light sensitive material is a photographic silver halide emulsion, since silver halide emulsions have a higher speed than most of the other known light sensitive materials.

The photographic silver halide emulsions which can be used in the practice of this invention include silver halide emulsions such as silver chloride, silver bromide, silver iodide, silver chlorobromide, silver chloroiodide, silver bromoiodide, silver chlorobromoiodide, etc. A particularly useful emulsion is a high contrast silver halide emulsion in which at least 60 mole-percent of the silver halide is silver chloride.

It is preferred to use gelatin as the sole binding agent for a photographic silver halide emulsion layer employed as a resist according to the invention. However, it will be appreciated that other photographic binding agents, i.e., hydrophilic colloids, can be used as substitutes in whole or in part for gelatin. In a particularly useful embodiment, an emulsion is used which can be hardened to a point where it has a melting point above about 180° F. and generally no higher than about 300° F. Suitable hydrophilic colloids include colloidal albumin, cellulose derivatives, synthetic resins, particularly polyvinyl compounds and the like. Water insoluble polymerized vinyl compounds, e.g., polymers of alkyl acrylates or methacrylates can also be included for improving dimensional stability.

When a photographic silver halide emulsion layer is used to form the resist employed in practicing this invention, it can be coated at a very wide silver halide coverage. A useful range is about 100 to 800 milligrams per square foot of gelatin, preferably 100 to 400 milligrams per square foot and about 50 to 200 milligrams per square foot of silver as silver halide, preferably 50 to 125 milligrams per square foot. The photographic emulsions described herein can be chemically sensitized such as with compounds of the sulfur groups, noble metal salts such as gold salts, reduction sensitized with reducing agents, combinations of these, etc. Furthermore, emulsion layers can be hardened with any suitable hardener such as aldehyde hardeners, aziridine hardeners, hardeners which are derivatives of dioxane, oxypolysaccharides, such as oxystarch, oxy plant gums and the like.

The photographic silver halide emulsions can also contain additional additives particularly those known to be beneficial in photographic emulsions, including for example stabilizers or antifoggants, particularly the water soluble inorganic acid salts of cadmium, cobalt, manganese and zinc as disclosed in U.S. Pat. No. 2,829,404, substituted triazaindolines as disclosed in U.S. Pat. Nos. 2,444,605 and 2,444,607, speed increasing materials, plasticizers, absorbing dyes and the like. Sensitizers which give particularly good results in typical emulsions useful in my invention are the alkylene oxide polymers which can be employed alone or in combination with other materials such as quaternary ammonium salts as disclosed in U.S. Pat. No. 2,886,437 or with mercury compounds and nitrogen-containing compounds, as disclosed in U.S. Pat. No. 2,751,299. The emulsions can be blue sensitized, orthochromatic, panchromatic, infrared sensitive, etc.

The silver halide emulsions used in practicing this invention include both negative and positive emulsions. Suitable positive emulsions which can be used include direct positive emulsions such as (1) hardened solarizing silver halide emulsions and (2) hardened internal latent image silver halide emulsions forming the latent image mostly inside the silver halide grains.

To increase sharpness, it may be desirable to include an antihaltion pigment or dye in the emulsion. Typical dyes and pigments used in antihalation layers may be used provided they are inert to the emulsion and do not affect the etch-bleach reaction. In a preferred embodiment, a carbon pigment is used. A useful amount of antihalation dye or pigment is 20 to 50 grams per silver mole.

It will be understood that photographic silver halide emulsion layers employed in the practice of this invention can be coated using methods known in the art.

It will be appreciated that any of the conventional silver halide developing agents can be used in the practice of this invention. Such developing agents can be incorporated into the element contiguous to silver halide, e.g., in the emulsion layer or in a contiguous layer. Typical developing agents include hydroquinone and substituted hydroquinone such as bromohydroquinone, chlorohydroquinone, toluhydroquinone, morpholinomethylhydroquinone, etc. It will also be appreciated that an auxiliary developing agent can be used in an amount of 0 to 20 percent of the hydroquinone or substituted hydroquinone in order to improve the speed without affecting the developing reaction.

Typical auxiliary agents include 3-pyrazolidone developing agents known in the art as well as Elon (N-methyl-p-aminophenol sulfate), and the like. Particularly useful auxiliary agents are 1-phenyl-3-pyrazolidone and 1-phenyl-4, -dimethyl-3-pyrazolidone.

Generally any convenient support can be used. However, since the adhesive material, particularly the preferred alphacyano acrylate polymer, results in a polymer which is hydrophobic. The support should have a hydrophilic surface or have a surface that can be made hydrophilic by subsequent treatment. When used in this application, it is understood that the term "hydrophilic surface" includes those surfaces which can be rendered hydrophilic by subsequent treatments. In particular, this applies to aluminum supports which have thereon a coating of aluminum oxide either caused by natural oxidation or by anodizing. In order to improve the hydrophilic nature on such a surface, it is customary to treat the surface with gum arabic or similar compound. A particularly useful support for use in this invention employs a hydrophilic coating over a support. Generally the hydrophilic coating will be placed directly on the support, particularly if the support is a metal such as aluminum. However, various other structures may be used such as those which would include resin coated paper having a coating such as polyethylene on one or both sides of the paper over which is then coated the hydrophilic layer. The emulsion and hydrophilic layers are adjacent or contiguous layers, preferably abutting. For instance, a thin layer containing Carey Lea silver might be interposed between the emulsion layer and the hydrophilic layer for purposes of the antihalation or the like. In a typical structure, the emulsion layer would be the outermost layer of the support. However it will be appreciated that a very thin layer of gelatin or a similar colloid might be coated over the emulsion layer in order to protect it from abrasion or the like.

Various surface layers can be coated over a supporting material to form a printing surface. Useful hydrophilic layers include crosslinked polyvinyl alcohol and acrylamide polymers which provide a very useful hydrophilic surface. For instance, polyvinyl alcohol combined with mineral pigments may be crosslinked with formaldehyde in combination with dihydroxydioxane in the presence of an acid catalyst. A particularly useful hydrophilic coating is disclosed in Perkins U.S. Pat. No. 3,055,295. Other methods of crosslinking polyvinyl alcohol may be used. For instance, a polyvinyl alcohol coating may be applied and then heated to a temperature above 160° C. (320° F.) for a sufficient length of time to render the coating water insoluble.

In addition to polyvinyl alcohol, various other hydrophilic colloidal materials may be used to provide a satisfactory hydrophilic layer including, for example, modified urea formaldehyde and melamine formaldehyde resins, modified urea formaldehyde and melamine formaldehyde resins treated with a water dispersable member of a class consisting of polycarboxy compounds, combined polyhydroxy, polycarboxy compounds and alkali metal silicates.

Although anodized aluminum is a particularly useful support in the practice of our invention, it will be appreciated that other supports can be used including metals such as copper, zinc, steel and the like. In addition, other supports including paper, glass, various polymeric materials such as polyesters, polyamides, polyolefins and the like may be used. Since a layer, e.g., polyacrylamide layer or similar coating can be used to provide the printing surfaces on a lithographic plate, various supports may be substituted under the surface layer without affecting the lithographic characteristic of a resulting plate. Therefore, the choice of support will generally depend upon the durability, availability and cost of the support material.

In practicing this invention, a developed silver halide emulsion is preferably processed to a lithographic plate with an etch-bleach solution. Such solutions typically contain an oxidizing agent such as hydrogen peroxide, an insoluble silver salt former such as chloride ion and a metal ion catalyst such as cupric ion. A gelatin softener such as citric acid and/or urea may also be incorporated in the etch bleach bath. The etch bleach solution can be applied by spraying, dipping, immersing, swabbing, etc. in the areas where silver has been formed resulting in bleaching silver image and at the same time degrading or etching gelatin in these same areas. The etch bleach application normally removes the gelatin in the image area. However, the emulsion may be washed to remove the etch bleach solution and any remaining softened colloid. If desired, the emulsion can then be reexposed to regular roomlight and then redeveloped to provide an image in those areas which were not etched. This provides a darkened image area for proofing purposes on the plate.

Examples of suitable etch bleach solutions useful in the practice of this invention are those containing cupric chloride, citric acid and hydrogen peroxide, such as Kodak Etch Bleach Bath EB-3 or EB-4, as follows:

*Kodak etch bleach bath EB-3*

| | | |
|---|---|---|
| Water, at 125° F. | cc. | 750 |
| Cupric chloride | g. | 10 |
| Citric acid | g. | 10 |
| Water to make | liter. | 1 |
| Hydrogen peroxide 3% | do. | 1 |

*Kodak etch bleach bath EB-4*

| | | |
|---|---|---|
| Water, at 125° F. | cc. | 600 |
| Cupric chloride | g. | 10 |
| Citric acid | g. | 150 |
| Urea | g. | 150 |
| Water to make | liter. | 1 |
| Hydrogen peroxide 3% | do. | 1 |

Another suitable etch bleach bath containing copper sulfate, citric acid, potassium bromide and hydrogen peroxide is known as Kodak Etch Bleach Bath EB-2. However, an etch bleach bath containing cupric chloride, citric acid, urea and hydrogen peroxide in which there is at least 20 grams per liter of cupric chloride is particularly suitable in producing a clean removal of the gelatin in the image areas in a period of time as short as 20 seconds. Such etch bleach solutions are described in application Ser. No. 650,616, filed concurrently herewith. Various other oxidizing compounds may be used in place of hydrogen peroxide such as hydrogen peroxide precursors and the like. However, oxidizing agents which are used in place of hydrogen peroxide must be those which act selectively on the image area where the silver image is located rather than attacking the complete emulsion layer which would be the case, for example, if nitric acid was utilized.

In practicing this invention, a polymerizable monomer is applied imagewise to a surface on a support. This surface can be a surface of the metal support itself or a layer coated upon the support. This polymerizable monomer forms an image in polymer on this surface. The monomer employed is generally an ethylenically unsaturated monomer, e.g., a vinylidene monomer containing a $CH_2=C<$ group, which polymerizes upon contacting the surface. A suitable class of polymerizable monomers are alpha-cyano acrylates, preferably those having the formula:

$$CH_2=C(CN)-C(=O)-OR$$

wherein R is alkyl of 1 to 16 carbon atoms, cyclohexyl or phenyl.

These polymerizable monomers are generally applied from a solution containing a stabilizing material, e.g., a mixture of sulfur dioxide and hydroquinone. Polymerizable monomers of this type, their preparation and stabilization are described in U.S. Pat. Nos. 2,763,677 issued Sept. 18, 1956 and 2,765,332 issued Oct. 2, 1956.

As a suitable solvent for the dilution and application of the alpha-cyano acrylates, solvents having moderate evaporation rates are most useful. Monochlorobenzene is a preferred solvent. A less volatile solvent, orthodichlorobenzene, is useful in reducing the evaporation rate providing a longer time for application. Isopropyl acetate and mixtures with the solvents may also be used. The amount of alpha-cyano acrylate in the coating solution used in practicing this invention may be varied over wide limits depending on the solvents and method of application. A particularly useful range is between 1/10 to 10 percent by weight of the monomer. The thickness of the deposited hydrophobic layer will depend upon the concentration of solvents and the coating application. Particularly useful layers are in the range of 1$\mu$ to 25$\mu$.

The following examples are intended to illustrate my invention but not to limit it in any way.

EXAMPLE 1—POSITIVE WORKING PLATE

An unhardened silver chloride emulsion containing an incorporated tanning developing agent is coated on an anodized aluminum support. This emulsion is exposed through a positive transparency and activated in an alkaline bath. The unhardened emulsion is washed off in warm water and dried to produce a negative image. The plate is then wiped using a cotton swab, wetted with the following solution:

10 parts of dichlorobenzene 3 parts of a 6 percent solution of monomeric ethyl-alpha-cyano acrylate in chlorobenzene 1 part blue dye (optional)

As the swab processing continues, the solvent evaporates and the alpha-cyano acrylate gradually polymerizes to produce a waxy, smooth layer. After removal of the last trace of solvent, the plate is swabbed with a sodium hypochlorite aqueous solution using a cloth pad and sufficient pressure so that the gelatin image is completely removed in the course of about 1 minute. The plate is rinsed in water at which time it is ready for inking and printing. The plate is printed on a standard lithographic press and produces several hundred excellent copies.

EXAMPLE 2—POSITIVE WORKING PLATE

A high contrast silver chlorobromide emulsion is coated onto an anodized aluminum support. After exposure to a high contrast line image, development is carried out in Kodak D-85 Developer for 2 minutes at 75° F., followed by a rinse in an acetic acid stop bath. The negative image is then bleached in a bichromate tanning bleach prepared from the following composition:

| | | | |
|---|---|---|---|
| A: | | | |
| | Water | cc. | 500 |
| | Ammonium bichromate | g. | 20 |
| | Sulfuric acid | cc. | 4 |
| | Water | liter. | 1 |
| B: | | | |
| | Sodium chloride | g. | 95 |
| | Water | liter. | 1 |

For use, one part of A is mixed with one part of B and diluted with six parts of water. After the bleach step, the gelatin in the nonexposed areas is removed by a warm water spray at 120° F. The gelatin stencil image is then dried. The entire plate is swabbed with a 6 percent solution of monomeric ethyl-alpha-cyano acrylate in chlorobenzene. The monomer polymerizes on the uncovered area of the aluminum surface. The plate is then treated with a dilute aqueous hypochlorite solution to remove the gelatin as in the previous example. The resulting high contrast lithographic plate shows excellent ink-water differential.

EXAMPLE 3—NEGATIVE WORKING PLATE (ETCH BLEACH REVERSAL)

A lithographic plate is prepared from an element comprising a light sensitive high contrast graphic arts silver chlorobromide emulsion on an anodized aluminum support. An original subject having both fine and broad line detail is copied in a process camera. The latent image is developed to a direct positive relief by using a peroxide etch reversal process. In this process, after initial exposure to a negative and conventional development by a silver halide developer, the silver image is bleached and the gelatin in the exposed, developed areas is removed. Subsequent treatment as in the previous examples is to apply a layer of methyl-alpha-cyano acrylate which polymerizes on the uncovered portions of the anodized aluminum surface and further treatment to remove gel resist results in a negative working lithographic plate of high quality.

EXAMPLE 4—POSITIVE WORKING PLATE ON CELLULOSE ACETATE SUPPORT

A high contrast emulsion containing incorporated developer as described in example 1 is coated on a subbed cellulose acetate support, exposed, activated in alkali and washed out in warm water. After drying, the emulsion side is brushed with a 5 percent solution of monomeric ethyl-alpha-cyano acrylate in isopropyl acetate and dried. The unprotected areas of the acetate sheet are then hydrolyzed for 1 to 1 ½minutes in a hydrolyzing bath consisting of:

| | |
|---|---|
| Water | 2400 cc. |
| Sodium hydroxide | 400 g. |
| Ethyl alcohol - 95 percent | 1,600 cc. |

The emulsion is then wiped off in warm water. The resulting film shows excellent ink-water differentiation and definition. The same procedure carried out using a halftone original results in an image having excellent dots.

EXAMPLE 5—POSITIVE WORKING PLATE BY TRANSFER OF RESIST IMAGE

A positive working plate is prepared on a hydrophilic paper support by transferring a gelatin relief image to the paper support. The transfer is made by colloid transfer employing an unhardened silver chloride emulsion on a matrix as disclosed in U.S. Pat. No. 2,763,553. The paper surface, with the transferred emulsion thereon, is then treated with a solution of monomeric ethyl-alpha-cyano acrylate as in example 4 to form hydrophobic printing areas on the hydrophilic paper support. The gelatin image is then removed to leave the polymeric image area on the hydrophilic paper support. A negative working plate is obtained by coating the matrix with the monomeric material and removing the resist in a similar manner.

The invention has been described in detail with particular reference to preferred embodiments thereof, but it will be understood that variations and modifications can be effected within the spirit and scope of the invention as described hereinabove and as defined in the appended claims.

I claim:

1. A process for preparing a printing plate which comprises imagewise application of an alpha-cyano acrylate having the formula:

$$CH_2=\overset{\displaystyle CN}{\overset{|}{C}}-\overset{\displaystyle O}{\overset{\|}{C}}-OR$$

wherein R is alkyl of 1 to 16 carbon atoms, cyclohexyl or phenyl, through open areas in a resist layer on a hydrophilic surface on a support upon which said acrylate polymerizes to form an image of polymer.

2. A process according to claim 1 in which said resist layer is removed and said surface having thereon image in polymer is contacted with ink and printed.

3. A process of claim 1 in which said support is metal.

4. A process of claim 1 in which said support is aluminum.

5. A process of claim 1 in which said support is paper.

6. A process of claim 1 in which said acrylate is methyl-alpha-cyano acrylate.

7. A process of claim 1 in which said acrylate is ethyl-alpha-cyano acrylate.

8. A printing plate comprising a support having a hydrophilic surface and having on said surface an image in an alpha-cyano acrylate polymer prepared from an alpha-cyano acrylate having the formula:

$$CH_2=\overset{\displaystyle CN}{\overset{|}{C}}-\overset{\displaystyle O}{\overset{\|}{C}}-OR$$

wherein R is alkyl of 1 to 16 carbon atoms, cyclohexyl or phenyl.

9. A printing plate of claim 8 in which said support is aluminum.

10. A process for preparing a printing plate which comprises imagewise application of an alpha-cyano acrylate having the formula:

$$CH_2=\overset{\displaystyle CN}{\overset{|}{C}}-\overset{\displaystyle O}{\overset{\|}{C}}-OR$$

wherein R is alkyl of 1 to 16 carbon atoms, cyclohexyl or phenyl to open areas in a resist layer on a hydrophilic surface on a support upon which said acrylate polymerizes to form an image in polymer said resist layer having been formed from a light sensitive silver halide emulsion.

11. A process according to claim 10 in which said resist layer comprises gelatin.

12. A process according to claim 10 in which said resist is formed by etching and bleaching an exposed and developed photographic silver halide emulsion.

13. A process according to claim 10 in which said resist is formed by developing an unhardened exposed photographic silver halide emulsion employing a tanning developer and removing unhardened areas.